(12) United States Patent
Yu et al.

(10) Patent No.: US 9,530,762 B2
(45) Date of Patent: Dec. 27, 2016

(54) SEMICONDUCTOR PACKAGE, SEMICONDUCTOR DEVICE AND METHOD OF FORMING THE SAME

(71) Applicant: Taiwan Semiconductor Manufacturing Company Limited, Hsinchu (TW)

(72) Inventors: Chen-Hua Yu, Hsinchu (TW); Chung-Shi Liu, Hsinchu (TW); Chih-Fan Huang, Kaohsiung (TW); Tsai-Tsung Tsai, Taoyuan County (TW); Wei-Hung Lin, Hsinchu County (TW); Ming-Da Cheng, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 22 days.

(21) Appl. No.: 14/152,168

(22) Filed: Jan. 10, 2014

(65) Prior Publication Data
US 2015/0200188 A1 Jul. 16, 2015

(51) Int. Cl.
| H01L 25/00 | (2006.01) |
| H01L 25/18 | (2006.01) |
| H01L 21/56 | (2006.01) |
| H01L 23/31 | (2006.01) |
| H01L 23/00 | (2006.01) |

(52) U.S. Cl.
CPC ............ *H01L 25/18* (2013.01); *H01L 21/561* (2013.01); *H01L 23/3114* (2013.01); *H01L 24/19* (2013.01); *H01L 25/50* (2013.01); *H01L 2224/32225* (2013.01); *H01L 2224/48095* (2013.01); *H01L 2224/48227* (2013.01); *H01L 2224/48465* (2013.01); *H01L 2224/73265* (2013.01); *H01L 2924/12042* (2013.01); *H01L 2924/181* (2013.01)

(58) Field of Classification Search
CPC ............ H01L 2224/48227; H01L 2224/73265; H01L 2224/73204; H01L 2924/0665; H01L 21/563; H01L 2224/73253; H01L 2224/81
USPC ................................ 257/E21.502, E23.116, E21.503, 257/E23.011, E21.499, 779, E23.066, 783, 790, 257/777; 438/107, 127, 118, 124
See application file for complete search history.

(56) References Cited

U.S. PATENT DOCUMENTS

| 2010/0184256 A1* | 7/2010 | Chino | H01L 21/561 438/118 |
| 2011/0233754 A1* | 9/2011 | Meyer-Berg | H01L 21/56 257/693 |
| 2012/0282739 A1* | 11/2012 | Brunschwiler | H01L 21/563 438/127 |
| 2013/0161784 A1* | 6/2013 | Jang | H01L 23/49838 257/528 |
| 2014/0246223 A1* | 9/2014 | Lee | H01L 23/13 174/250 |

\* cited by examiner

*Primary Examiner* — Calvin Choi
*Assistant Examiner* — Xiaoming Liu
(74) *Attorney, Agent, or Firm* — Jones Day

(57) ABSTRACT

According to an exemplary embodiment, a semiconductor package is provided. The A semiconductor package includes at least one chip, and at least one component adjacent to the at least one chip, wherein the at least one chip and the at least one component are molded in a same molding body.

30 Claims, 8 Drawing Sheets

100

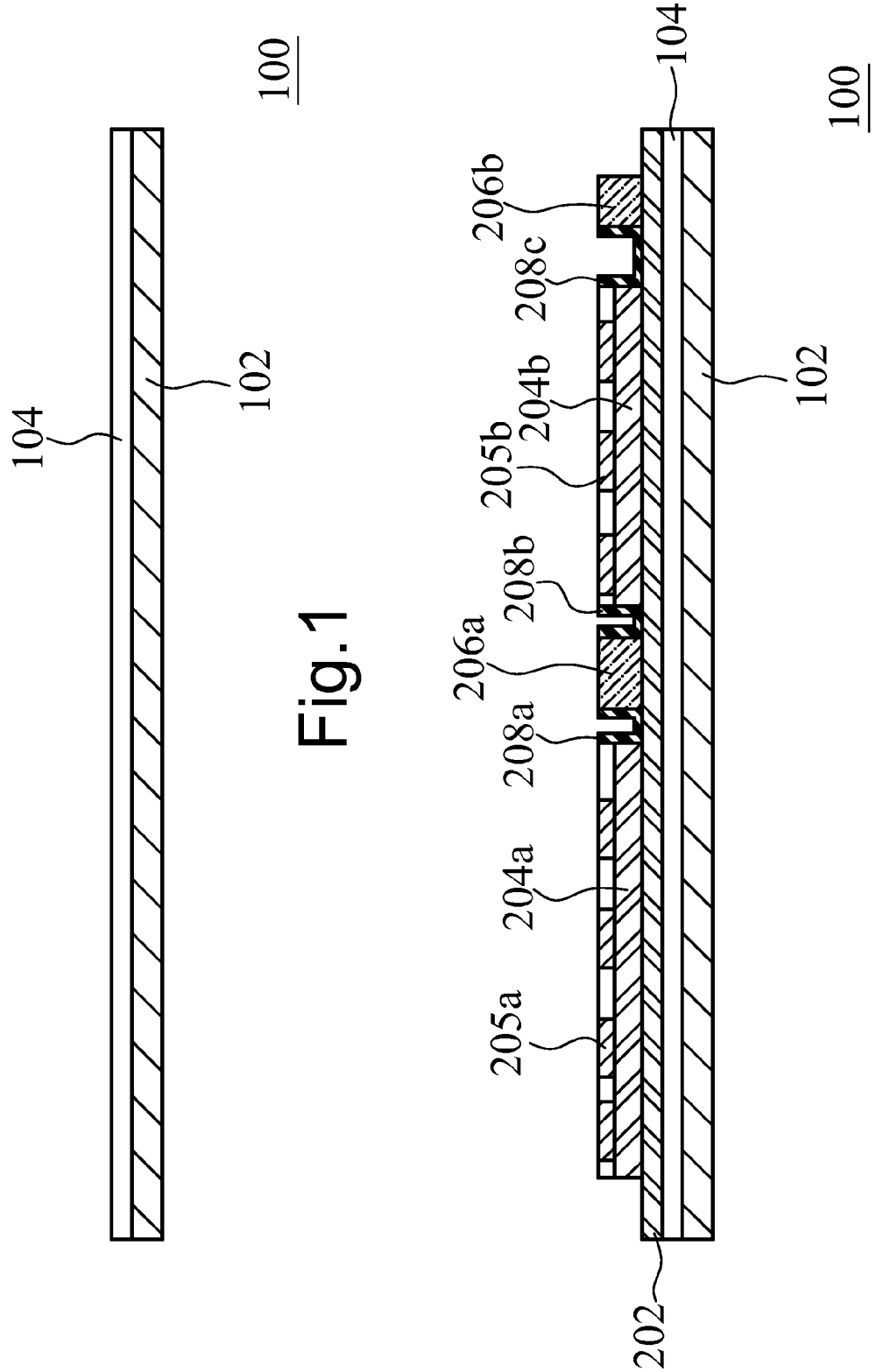

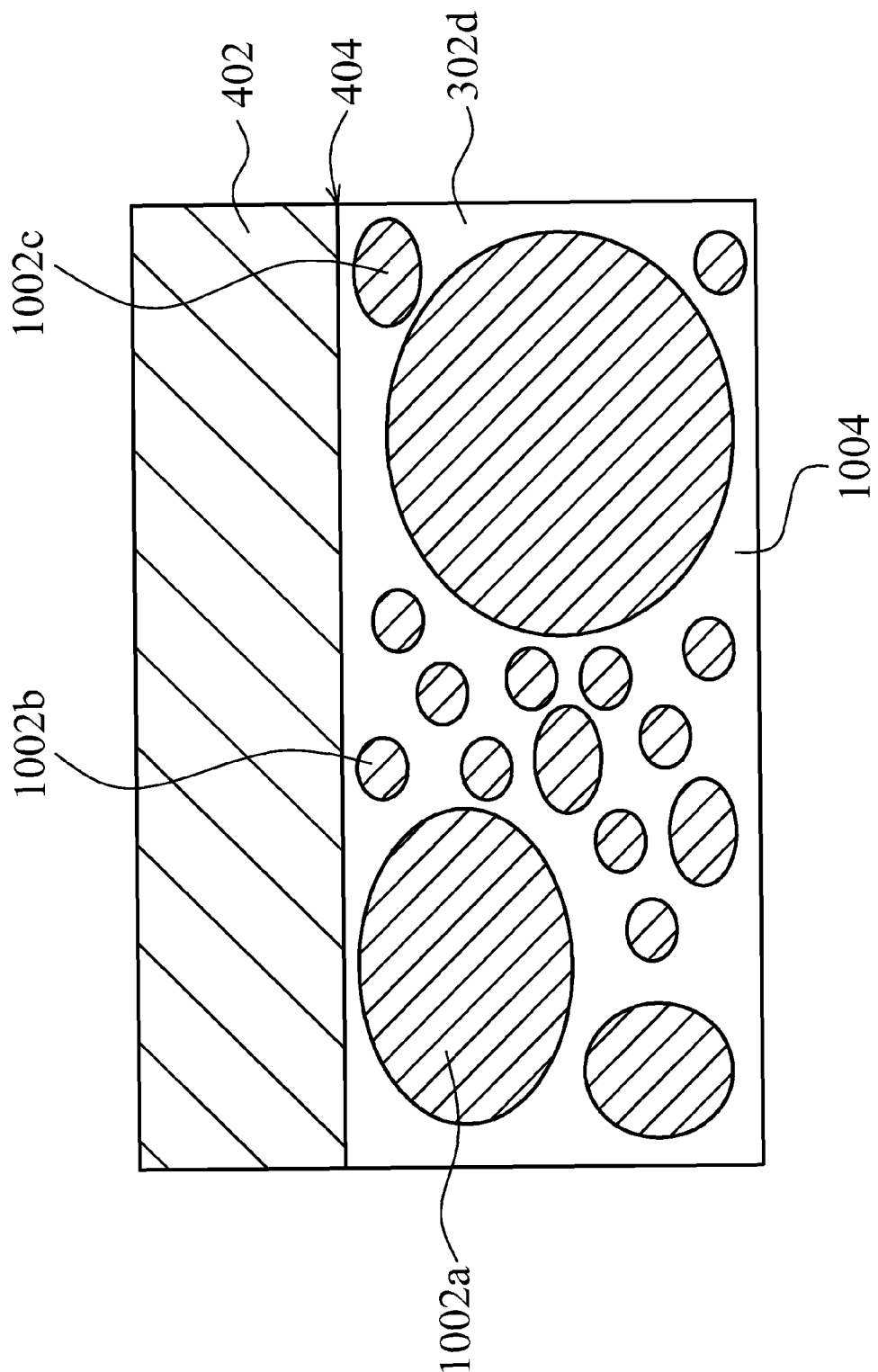

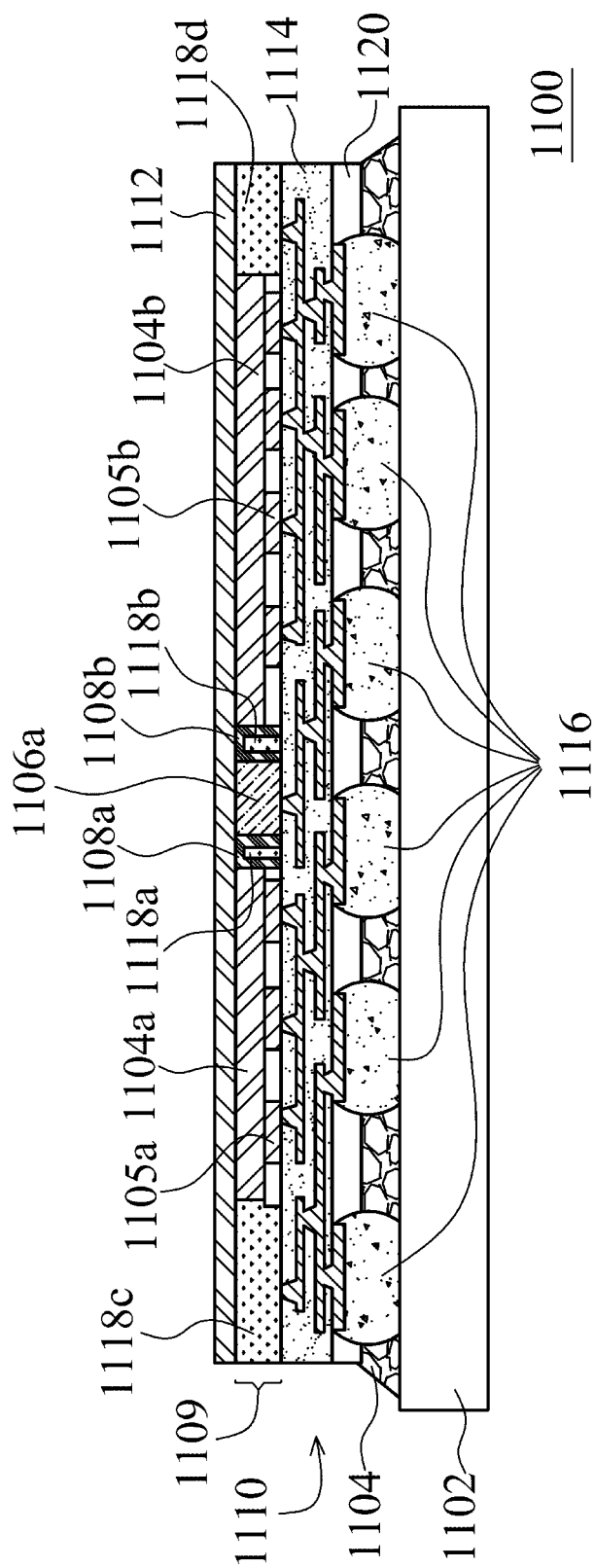

SEMICONDUCTOR PACKAGE, SEMICONDUCTOR DEVICE AND METHOD OF FORMING THE SAME

FIELD

This disclosure relates generally to semiconductors, and, more particularly, to a semiconductor package and a method of forming the same.

BACKGROUND

Passive components and chips are distributed on the printed circuit board and are electrically connected by routings of the printed circuit board. Such connection may induce a large area and thickness overhead. Therefore, there is a need to reduce this overhead.

BRIEF DESCRIPTION OF THE DRAWINGS

FIG. 1 is a sectional view illustrating an exemplary semiconductor package according to an exemplary embodiment.

FIG. 2 is a sectional view illustrating the exemplary semiconductor package according to the exemplary embodiment.

FIG. 10 is a block diagram illustrating a portion of the molding compound in contact with the redistribution layer of the exemplary semiconductor package according to the exemplary embodiment in view of microscope.

FIG. 11 is a sectional view illustrating an exemplary semiconductor device according to an exemplary embodiment.

FIG. 12 is a flow chart for forming a semiconductor device according to an exemplary embodiment.

DETAILED DESCRIPTION

Figure 3:
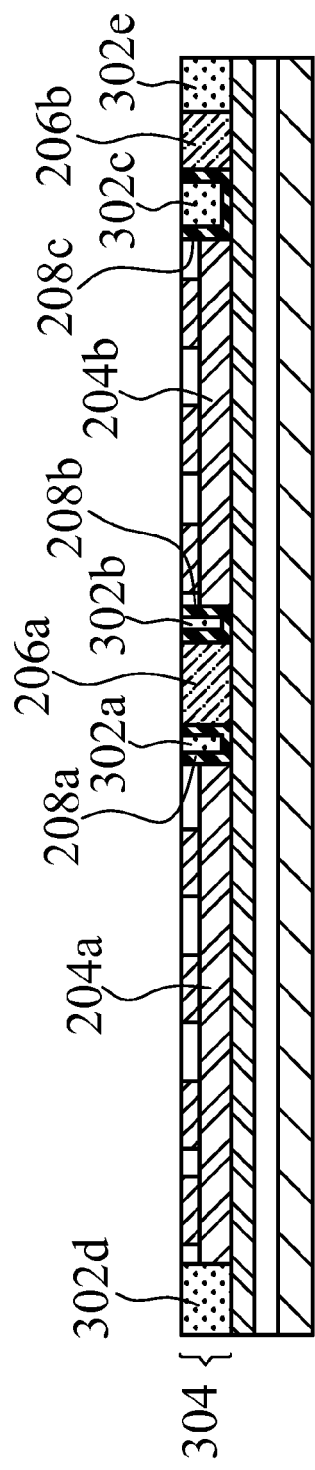
FIG. 3 is a sectional view illustrating the exemplary semiconductor package according to the exemplary embodiment.

Reference will now be made in detail to exemplary embodiments that are illustrated in the accompanying drawings. Wherever possible, the same reference numbers will be used throughout the drawings to refer to the same or like parts.

The disclosure describes a semiconductor package that combines components and chips in the same mold body by using a novel mask layer structure and a direct exposed molding process. The mask layer structure refers to a mask layer disposed between the components and the chips. The direct exposed molding process may refer to a process whereby the components and the chips (or die) are directly exposed after molding, without use of a grinding process.

The direct expose molding process may also refer to a transfer molding process or a compression molding process. Transfer molding or compression molding is a process where the amount of molding material is measured and inserted before the molding takes place. The molding material is preheated and loaded into a chamber known as a pot. A plunger is then used to force the material from the pot through channels, known as a sprue and runner system, into mold cavities. The mold remains closed as the material is inserted and is opened to release the part from the sprue and runner system. The mold walls are heated to a temperature above the melting point of the mold material; this allows a faster flow of material through the cavities.

The chips may be the chip is selected from the group consisting of silicon semiconductors or iii-v semiconductors silicon semiconductors or iii-v semiconductors, and the chips may comprise a microelectromechanical system (MEMS). The components are disposed in a fan-out area of the semiconductor package.

By using the direct exposed molding process, the components and the chips may be integrated in the same layer and molded at the same time. It is noted that the components may be passive components, such as resistor, inductors, or capacitors. Furthermore, components and chips having a similar height may be interconnected by a redistribution layer, reducing yield loss issues due to extra connections between the components and the chips.

FIG. 1 is a sectional view illustrating an exemplary semiconductor package 100 according to an exemplary embodiment. As shown in FIG. 1, a temporary bonding layer 104 is coated over a carrier 102. The carrier 102 may be formed of, for example, metal or glass.

FIG. 2 is a sectional view illustrating the exemplary semiconductor package 100 according to the exemplary embodiment. As shown in FIG. 2, an attach film 202 may be provided over the temporary bonding layer 104. The attach film 202 may be formed of, for example, epoxy or polymer. Chips 204a, 204b and components 206a, 206b are provided over the attach film 202. The chips 204a, 204b respectively include I/Os 205a, 205b. Mask layers 208a, 208b, 208c are provided between the chips 204a, 204b and the components 206a, 206b. The components 206a, 206b may be passive components, such as resistor, inductors or capacitors. The width of the components 206a, 206b may be, for example, 100-500 micrometer. The distance between the chips 204a, 204b and the components 206a, 206b may be, for example, 50-300 micrometer.

FIG. 3 is a sectional view illustrating the exemplary semiconductor package 100 according to the exemplary embodiment. As shown in FIG. 3, molding compounds 302a, 302b, 302c are provided in recesses (or gates) of the mask layers 208a, 208b, 208c by using a direct expose molding process to form the molding body 304. Molding compounds 302d, 302e are provided between different packages. Therefore, the chips 204a, 204b and the components 206a, 206b are molded in the same molding body 304. The mask layers 208a, 208b, 208c may be formed of, for example, polymer. The mask layers 208a, 208b, 208c between the chips 204a, 204b and the components 206a, 206b make molding compounds have a more balanced flow and also enhance recess filling ability.

In the embodiment, the semiconductor package 100 may include the chips 204a, 204b, the components 206a, 206b and the molding compounds 302a-302e. The components 206a, 206b are adjacent to the chips 204a, 204b. The molding compounds 302a-302e are disposed between the chips 204a, 204b and the components 206a, 206b. The chips 204a, 204b, the components 206a, 206b and the molding compounds 302a-302e may form the molding body 304.

Figure 4:
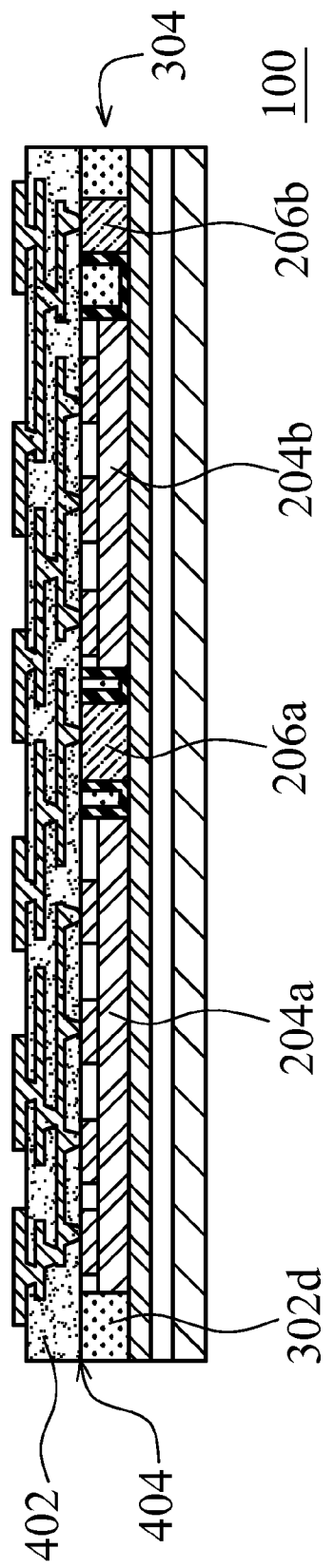
FIG. 4 is a sectional view illustrating the exemplary semiconductor package according to the exemplary embodiment.

FIG. 4 is a sectional view illustrating the exemplary semiconductor package 100 according to the exemplary embodiment. As shown in FIG. 4, a redistribution layer (RDL) 402 is provided over the molding body 304 and connected to the chips 204a, 204b and the components 206a, 206b.

Figure 5:
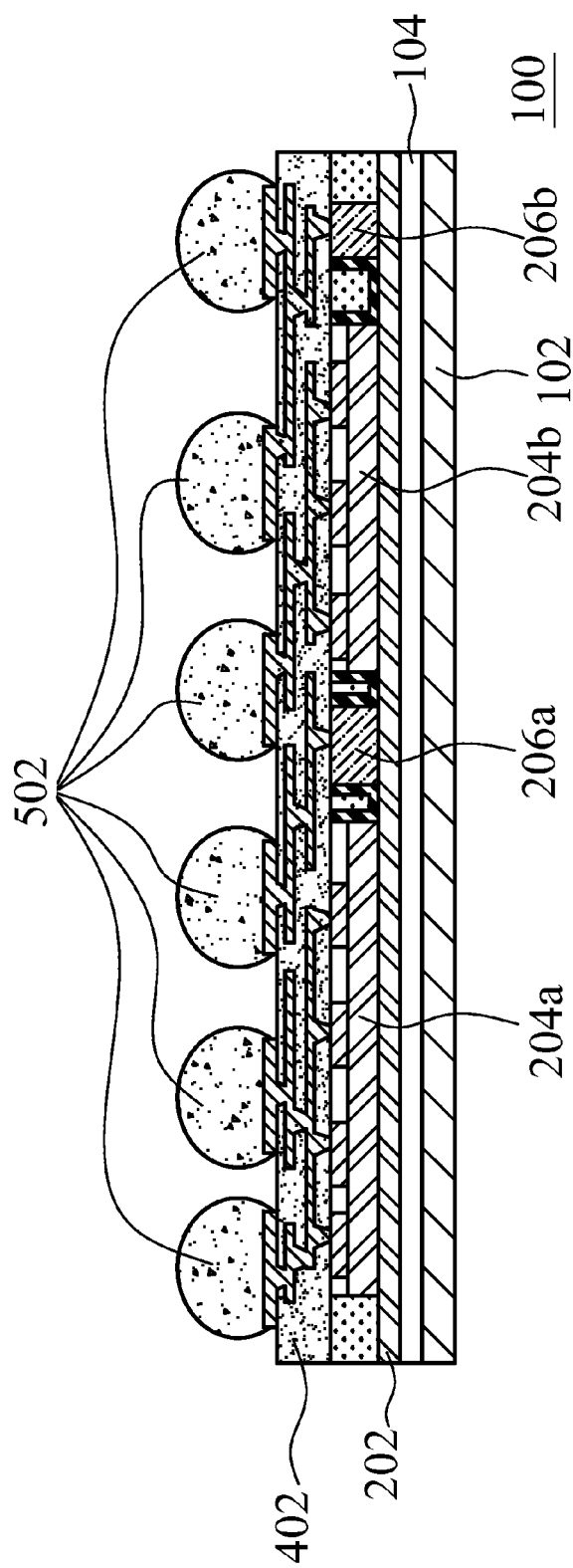
FIG. 5 is a sectional view illustrating the exemplary semiconductor package according to the exemplary embodiment.

FIG. 5 is a sectional view illustrating the exemplary semiconductor package 100 according to the exemplary embodiment. As shown in FIG. 5, metal bumps 502 are provided over the redistribution layer (RDL) 402, and are connected to the chips 204a, 204b and the components 206a, 206b by the redistribution layer (RDL) 402.

Figure 6:
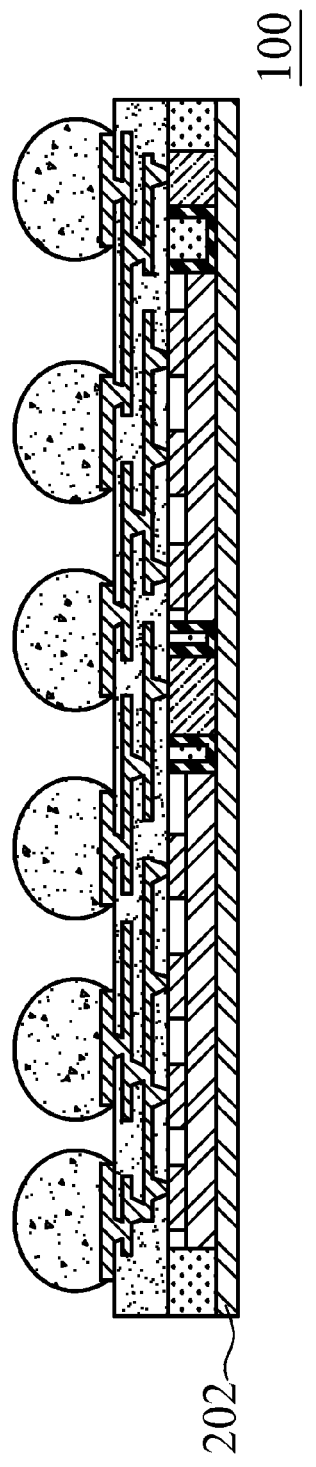
FIG. 6 is a sectional view illustrating the exemplary semiconductor package according to the exemplary embodiment.

FIG. 6 is a sectional view illustrating the exemplary semiconductor package 100 according to the exemplary embodiment. As shown in FIG. 6, by applying a laser beam or a heater to the temporary bonding layer 104, the semiconductor package 100 is debonded from the carrier 102 (shown in FIG. 5).

Figure 7:
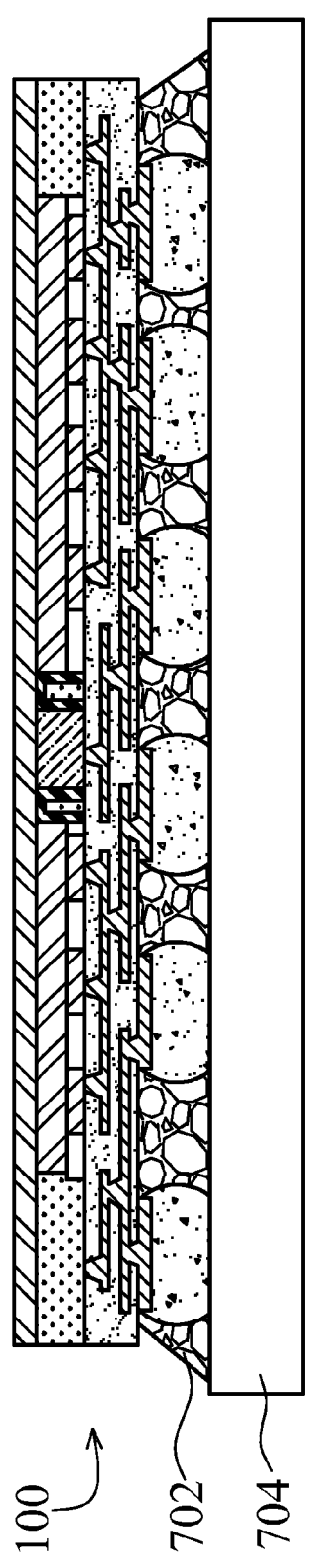
FIG. 7 is a sectional view illustrating an exemplary semiconductor device according to an exemplary embodiment.

FIG. 7 is a sectional view illustrating an exemplary semiconductor device 700 according to an exemplary embodiment. As shown in FIG. 7, the semiconductor package 100 is provided over and connected to a printed circuit board 704. An underfill 702 such as epoxy is injected under the semiconductor package 100 after it is soldered to the printed circuit board 704, effectively gluing the semiconductor package 600 to the printed circuit board 704. As such, a semiconductor device 700 is provided.

Figure 8:
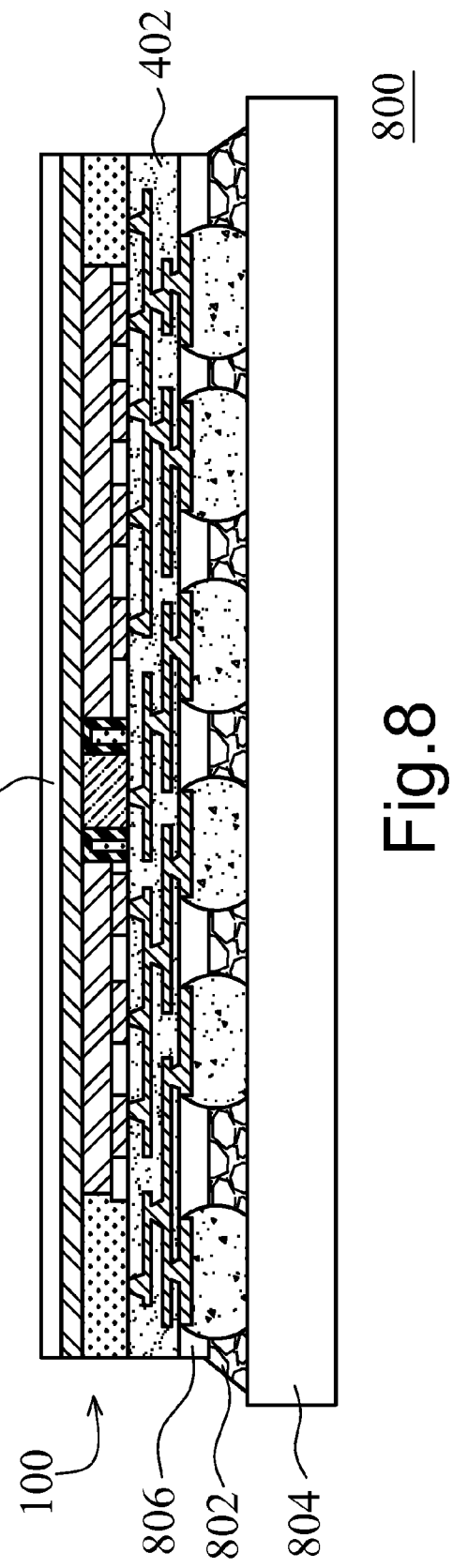
FIG. 8 is another sectional view illustrating an exemplary semiconductor device according to an exemplary embodiment.

FIG. 8 is another sectional view illustrating an exemplary semiconductor device 800 according to an exemplary embodiment. Continuing from FIG. 6, as shown in FIG. 8, the semiconductor package 100 is provided over and connected to a printed circuit board 804. An underfill 802 such as epoxy is injected under the semiconductor package 100 after it is soldered to the printed circuit board 804, effectively gluing the semiconductor package 600 to the printed circuit board 804. Additionally, a lithography manufacturability check layer 806 is disposed between the redistribution layer 402 and the printed circuit board 804. A lid (or a backside protection film) 808 is disposed over the semiconductor package 100.

Figure 9:
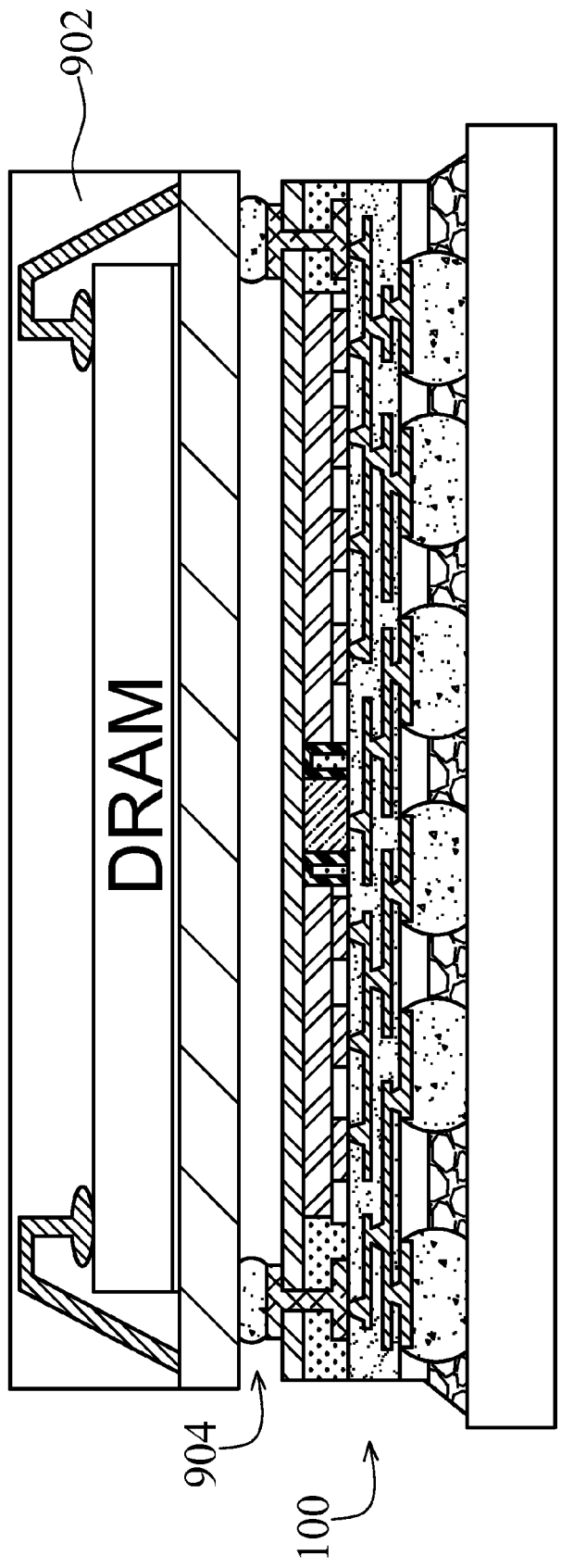
FIG. 9 is another sectional view illustrating an exemplary semiconductor device according to an exemplary embodiment.

FIG. 9 is another sectional view illustrating an exemplary semiconductor device 900 according to an exemplary embodiment. Continuing from FIG. 6, as shown in FIG. 9, a memory 902 is disposed over and connected to the semiconductor package 100 by using a package-on-package structure 904. The rest of the elements in FIG. 9 are similar to FIG. 8 and are not repeated herein.

FIG. 10 is a block diagram illustrating a portion of the molding compound in contact with the redistribution layer of the exemplary semiconductor package according to the exemplary embodiment in view of microscope. As shown in FIGS. 4 and 10, an exemplary diagram illustrating a photomicrograph of the molding compound 302d is provided. In the embodiment, the molding compound 302d may include epoxy 1004 and glass ball fillers 1002a, 1002b, 1002c, where a substantial number of the glass ball fillers have an intact shape because the direct exposed molding process is performed without an additional grinding process. Otherwise, if a grinding process were performed on the molding compound 302d, the glass ball fillers 1002a, 1002b, 1002c near the junction 404 between the molding compound 302d and the redistribution layer 402 may show a cut-off shape or a cleaved shape. It can be easily observed that any semiconductor device having the semiconductor package abovementioned showing glass ball fillers having an intact shape instead of a cut-off shape or a cleaved shape fall into the scope of the disclosure.

FIG. 11 is a sectional view illustrating an exemplary semiconductor device according to an exemplary embodiment. As shown in FIG. 11, a semiconductor device is 1100 is provided. The semiconductor device 1100 includes a semiconductor package 1110, a printed circuit board 1102 and an underfill layer 1104.

The semiconductor package 1110 includes chips 1104a, 1104b and a component 1106a. The component 1106a is adjacent to the chips 1104a, 1104b. The chips 1104a, 1104b and the component 1106a are molded in a same molding body 1109. The component 1106a may be passive components, such as resistor, inductors, or capacitors.

In the embodiment, the semiconductor package 1110 may include the chips 1104a, 1104b, the components 1106a and the molding compounds 1118a-1118d. The component 1106a is adjacent to the chips 1104a, 1104b. The molding compounds 1118a-1118d are disposed between the chips 1104a, 1104b and the components 1106a. The chips 1104a, 1104b, the components 206a and the molding compounds 1118a-1118d form the molding body 1109.

In the exemplary embodiment, the chips 1104a, 1104b respectively include I/Os 1105a, 1105b. Mask layers 1108a, 1108b are provided between the chips 1104a, 1104b and the component 1106a. Molding compounds 1118a, 1118b, 1118c are provided in recesses (or gates) of the mask layers 1108a, 1108b by using a direct expose molding process to form the molding body 1109. Molding compounds 1108c, 1108d are provided between different packages. In the exemplary embodiment, the chips 1104a, 1104b and the component 1106a may be molded in the molding body 1109 by using a direct expose molding process.

In the exemplary embodiment, the semiconductor package 1110 may further include an attach film 1112. The attach film 1112 may be formed of, for example, epoxy or polymer. The width of the component 1106a may be, for example, 100-500 micrometer. The distance between the chips 1104a, 1104b and the component 1106a may be, for example, 50-300 micrometer.

In the exemplary embodiment, the semiconductor package 1110 may further include a redistribution layer (RDL) 1114 connected to the chips 1104a, 1104b and the component 1106a.

In the exemplary embodiment, the semiconductor package 1110 may further include metal bumps 1116 connected to the chips 1104a, 1104b and the component 1106a by the redistribution layer 1114.

In the exemplary embodiment, the semiconductor package 1110 is provided over and connected to a printed circuit board 1102. An underfill 1104 such as epoxy is injected under the semiconductor package 1110 after it is soldered to the printed circuit board 1102, effectively gluing the semiconductor package 1110 to the printed circuit board 1102. Additionally, a lithography manufacturability check layer 1120 is disposed between the redistribution layer 1114 and the printed circuit board 1102.

In the exemplary embodiment, the chips 1104a, 1104b may be at least one of silicon semiconductors or iii-v semiconductors. In the exemplary embodiment, the chips 1104a, 1104b may include a microelectromechanical system (MEMS). In the exemplary embodiment, the chips 1104a, 1104b may be application processors.

In the exemplary embodiment, the molding compounds 1118a-1118d may include epoxy and ball fillers having an intact shape instead of a cleaved shape. In the exemplary embodiment, the component 1106a may be disposed in a fan-out area of the semiconductor package 1110. In the exemplary embodiment, a semiconductor device 1100 may further include a memory disposed over and connected to the semiconductor package 1110 by using a package-on-package structure. In the exemplary embodiment, a semiconductor device 1100 may further include a lid disposed over the semiconductor package 1110.

FIG. 12 is a flow chart for forming a semiconductor device according to an exemplary embodiment. As shown in FIG. 12, a method 1200 is provided. The method 1200 includes the following operation: molding at least one chip and at least one component in a same molding body (1202).

Figure 13:
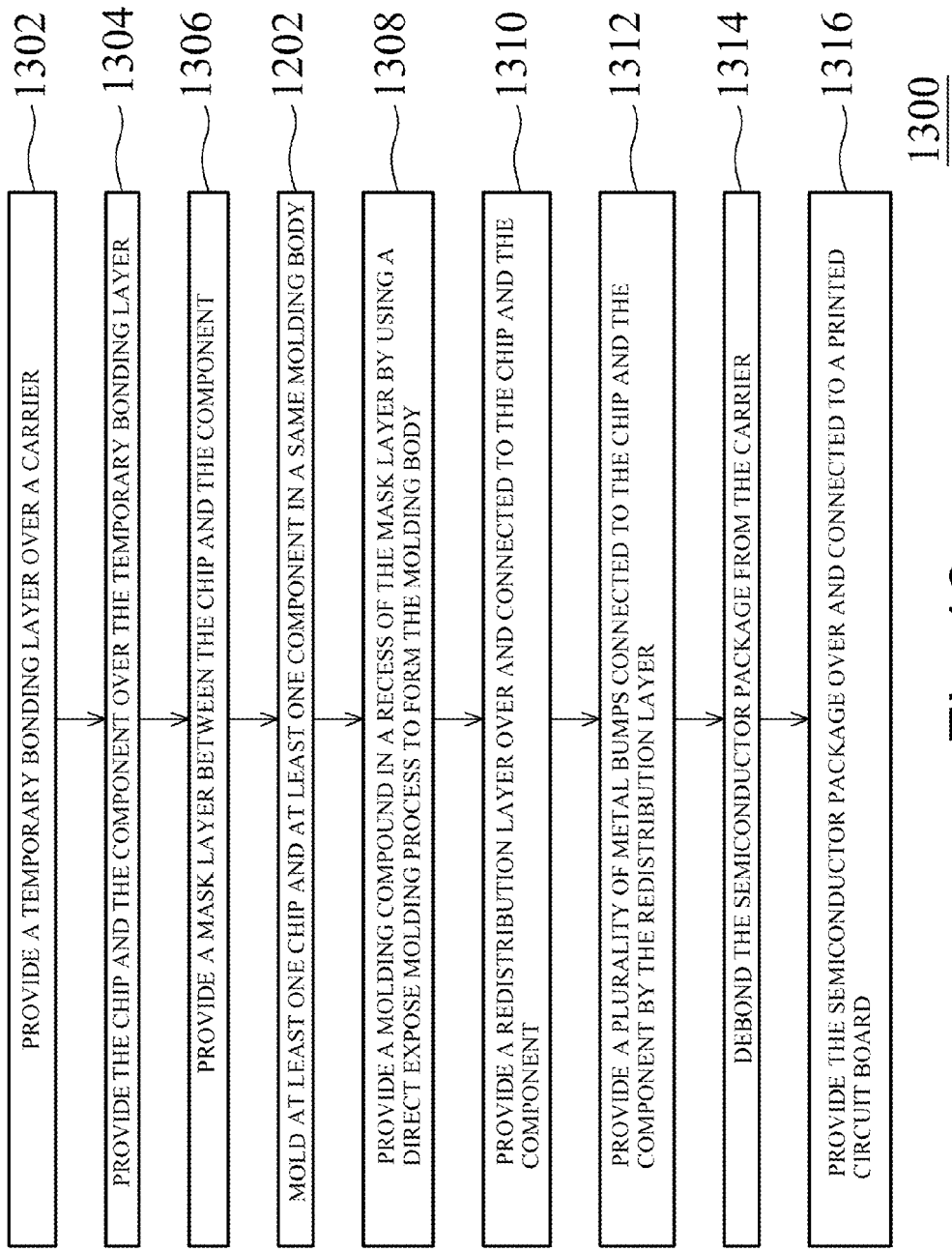
FIG. 13 is a flow chart for forming a semiconductor device according to an exemplary embodiment.

FIG. 13 is a flow chart for forming a semiconductor device according to an exemplary embodiment. As shown in FIG. 13, a method 1300 is provided. The method 1300 includes the following operations: providing a temporary bonding layer over a carrier (1302); providing the chip and the component over the temporary bonding layer (1304); providing a mask layer between the chip and the component (1306); molding at least one chip and at least one component in a same molding body (1202); providing a molding compound in a recess of the mask layer by using a direct expose molding process to form the molding body (1308); providing a redistribution layer over and connected to the chip and the component (1310); providing a plurality of metal bumps connected to the chip and the component by the redistribution layer (1312); debonding the semiconductor package from the carrier (1314); and providing the semiconductor package over and connected to a printed circuit board (1316).

In the exemplary embodiment, the method 1300 may further include: providing a lithography manufacturability check layer disposed between the redistribution layer and the printed circuit board. In the exemplary embodiment, the method 1300 may further include: providing a memory disposed over and connected to the semiconductor package by using a package-on-package structure. In the exemplary embodiment, the operation 1308 may further include: providing the molding compound by the direct expose molding process without a grinding process so that the molding compound comprises epoxy and ball fillers without a cleaved shape.

According to an exemplary embodiment, a method of forming a semiconductor device is provided. The method includes the following operation: molding at least one chip and at least one component in a same molding body.

According to an exemplary embodiment, a semiconductor device is provided. The semiconductor device includes a semiconductor package, a printed circuit board and an underfill layer. The semiconductor package includes: at least one chip; at least one component adjacent to the at least one chip, wherein the at least one chip and the at least one component are molded in a same molding body; a molding compound disposed between the at least one chip and the at least one component to form the molding body; a redistribution layer connected to the at least one chip and the at least one component; and a plurality of metal bumps connected to the at least one chip and the at least one component by the redistribution layer. The printed circuit board is connected to the semiconductor package by the metal bumps. The underfill layer is disposed between the printed circuit board and the semiconductor package.

According to an exemplary embodiment, a semiconductor package is provided. The semiconductor package includes at least one chip; at least one component adjacent to the at least one chip; and a molding compound disposed between the at least one chip and the at least one component, wherein the at least one chip, the at least one component and the molding compound form a molding body.

This written description uses examples in the disclosure to: disclose the best mode and also to enable a person ordinarily skilled in the art to make and use the disclosure. The patentable scope may include other examples that occur to those skilled in the art.

One skilled in the relevant art upon reading this disclosure will recognize that the various embodiments may be practiced without one or more of the specific details, or with other replacement and/or additional methods, materials, or components. Well-known structures, materials, or operations may not be shown or described in detail to avoid obscuring aspects of various embodiments. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein may be manufactured, used, or shipped in a number of positions and orientations. Persons skilled in the art will recognize various equivalent combinations and substitutions for various components shown in the figures.

What is claimed is:

1. A semiconductor package, comprising:
   at least one chip;
   at least one passive component adjacent to the at least one chip;
   a mask layer having a recess formed therein, the mask layer being disposed between the at least one chip and the at least one passive component, wherein the chip, the passive component, and the mask layer are disposed on the same plane; and a molding compound disposed in the recess and between the at least one chip and the at least one passive component, wherein the at least one chip, the at least one passive component and the molding compound form a molding body, and wherein a thickness of the molding compound in the recess is equal to a height of the recess.

2. The package of claim 1, further comprising a redistribution layer connected to the at least one chip and the at least one passive component.

3. The package of claim 1, further comprising a plurality of metal bumps connected to the at least one chip and the at least one passive component by the redistribution layer.

4. The package of claim 1, wherein the molding compound comprises epoxy and ball fillers without a cleaved shape.

5. The package of claim 1, wherein the at least one passive component is disposed in a fan-out area of the semiconductor package.

6. The package of claim 1, wherein the at least one chip comprises a material selected from the group consisting of silicon semiconductors or iii-v semiconductors.

7. The package of claim 1, wherein the at least one chip comprises microelectromechanical systems (MEMS).

8. The package of claim 1, further comprising an attach film on which the molding body is disposed.

9. The package of claim 1, wherein one sidewall of the mask layer is in contact with the chip, and another sidewall of the mask layer is in contact with the passive component.

10. The semiconductor package of claim 1, wherein the mask layer comprises:
 a first portion that coats a sidewall of the at least one chip,
 a second portion that coats a sidewall of the at least one passive component, and
 a third portion that coats a portion of a film over which the at least one chip and the at least one passive component are disposed, wherein the first, second, and third portions are connected and form a continuous layer.

11. The semiconductor package of claim 10,
wherein the first portion of the mask layer comprises a first sidewall of the recess,
wherein the second portion of the mask layer comprises a second sidewall of the recess, and
wherein the third portion comprises a bottom portion of the recess.

12. The semiconductor package of claim 1, wherein the mask layer comprises a single recess formed between the at least one chip and the at least one passive component.

13. The semiconductor package of claim 1, further comprising:
 a layer of input/outputs (I/Os) formed directly over the at least one chip.

14. The semiconductor package of claim 13, further comprising:
 a planar surface having regions of different material composition, wherein materials present at the planar surface include respective materials of (i) the layer of I/Os, (ii) the mask layer, (iii) the molding compound, and (iv) the at least one passive component.

15. The semiconductor package of claim 13, wherein the layer of I/Os and the at least one chip form a first sidewall, and wherein the mask layer comprises:
 a first portion that coats an entirety of the first sidewall, and
 a second portion that coats an entirety of a sidewall of the at least one passive component.

16. A semiconductor device, comprising:
 a semiconductor package, comprising:
 at least one chip;
 at least one passive component adjacent to the at least one chip, wherein the at least one chip and the at least one passive component are molded in a same molding body;
 a mask layer having a recess formed therein, the mask layer being disposed between the at least one chip and the at least one passive component, wherein the chip, the passive component, and the mask layer are disposed on the same plane;
 a molding compound disposed in the recess and between the at least one chip and the at least one passive component to form the molding body, wherein a thickness of the molding compound in the recess is equal to a height of the recess;
 a redistribution layer connected to the at least one chip and the at least one passive component;
 a plurality of metal bumps connected to the at least one chip and the at least one passive component by the redistribution layer;
 a printed circuit board connected to the semiconductor package by the metal bumps; and
 an underfill layer disposed between the printed circuit board and the semiconductor package.

17. The device of claim 16, wherein the semiconductor package further comprises a lithography manufacturability check layer disposed between the redistribution layer and the printed circuit board.

18. The device of claim 16, wherein the at least one chip is an application processor.

19. The device of claim 16, further comprising a memory disposed over and connected to the semiconductor package by using a package-on-package structure.

20. The device of claim 16, further comprising a lid disposed over the semiconductor package.

21. The device of claim 16, wherein one sidewall of the mask layer is in contact with the chip, and another sidewall of the mask layer is in contact with the passive component.

22. The semiconductor device of claim 16, wherein the mask layer comprises:
 a first portion that coats a sidewall of the at least one chip,
 a second portion that coats a sidewall of the at least one passive component, and
 a third portion that coats a portion of a film over which the at least one chip and the at least one passive component are disposed, wherein the first, second, and third portions are connected and form a continuous layer.

23. The semiconductor device of claim 22,
wherein the first portion of the mask layer comprises a first sidewall of the recess,
wherein the second portion of the mask layer comprises a second sidewall of the recess, and
wherein the third portion comprises a bottom portion of the recess.

24. A method of forming a semiconductor device, comprising:
 providing a temporary bonding layer over a carrier;
 providing a chip and a passive component over the temporary bonding layer;
 providing a mask layer having a recess formed therein between the chip and the passive component, the mask layer being disposed on the same plane with the chip and the passive component;

providing a molding compound in the recess of the mask layer by using a direct expose molding process to form the molding body so as to mold the chip and the passive component in the same molding body, wherein a thickness of the molding compound in the recess is equal to a height of the recess;

providing a redistribution layer over and connected to the chip and the passive component;

providing a plurality of metal bumps connected to the chip and the passive component by the redistribution layer;

debonding the semiconductor package from the carrier; and providing the semiconductor package over and connected to a printed circuit board.

25. The method of claim 24, further comprising providing a lithography manufacturability check layer disposed between the redistribution layer and the printed circuit board.

26. The method of claim 24, further comprising providing a memory disposed over and connected to the semiconductor package by using a package-on-package structure.

27. The method of claim 24, further comprising providing a lid disposed over the semiconductor package.

28. The method of claim 24, wherein providing the molding compound in the recess of the mask layer by using the direct expose molding process further comprises: providing the molding compound by the direct expose molding process without a grinding process so that the molding compound comprises epoxy and ball fillers without a cleaved shape.

29. The method of claim 24, wherein the mask layer comprises:
 a first portion that coats a sidewall of the chip,
 a second portion that coats a sidewall of the passive component, and
 a third portion that coats a portion of a film over which the chip and the passive component are disposed, wherein the first, second, and third portions are connected and form a continuous layer.

30. The method of claim 29,
 wherein the first portion of the mask layer comprises a first sidewall of the recess,
 wherein the second portion of the mask layer comprises a second sidewall of the recess, and
 wherein the third portion comprises a bottom portion of the recess.

* * * * *